United States Patent [19]

Iwamura et al.

[11] Patent Number: 4,849,658
[45] Date of Patent: Jul. 18, 1989

[54] DYNAMIC LOGIC CIRCUIT INCLUDING BIPOLAR TRANSISTORS AND FIELD-EFFECT TRANSISTORS

[75] Inventors: Masahiro Iwamura; Takashi Hotta; Hideo Maejima, all of Hitachi, Japan

[73] Assignee: Hitachi, Ltd., Tokyo, Japan

[21] Appl. No.: 81,696

[22] Filed: Aug. 4, 1987

[30] Foreign Application Priority Data

Aug. 8, 1986 [JP] Japan ................. 61-185133

[51] Int. Cl.[4] ............................................. H03K 19/01
[52] U.S. Cl. ..................................... 307/446; 307/443; 307/452; 307/481; 307/570
[58] Field of Search ............... 307/443, 446, 448, 451, 307/452-453, 481, 570, 270

[56] References Cited

U.S. PATENT DOCUMENTS

| | | | |
|---|---|---|---|
| 4,569,032 | 2/1986 | Lee | 307/481 X |
| 4,604,535 | 8/1986 | Sasayama et al. | 307/570 X |
| 4,694,202 | 9/1987 | Iwamura et al. | 307/570 X |
| 4,700,086 | 10/1987 | Ling et al. | 307/452 X |

FOREIGN PATENT DOCUMENTS

| | | | |
|---|---|---|---|
| 0064870 | 11/1982 | European Pat. Off. | 307/446 |
| 0099100 | 1/1984 | European Pat. Off. | 307/446 |
| 0147598 | 7/1985 | European Pat. Off. | 307/452 |

OTHER PUBLICATIONS

Kalthoff, "Dynamic CMOS Techniques Save Space", Elektronik, vol. 23, No. 7, Jul. 1974, pp. 264-265.

Primary Examiner—David Hudspeth
Attorney, Agent, or Firm—Antonelli, Terry & Wands

[57] ABSTRACT

A dynamic logic circuit is provided which is arranged to realize high speed operation. At least one bipolar transistor is provided having a collector, a base and an emitter, with the collector-emitter current path connected between the output of the dynamic logic circuit and a first potential. A precharging device is coupled between a second potential and the output of the dynamic logic circuit to precharge the output according to at least one clock signal which periodically changes its state. Further, at least two field-effect transistors are provided, wherein one assumes an on or off state opposite to that of the precharging means in response to the clock signal while the other operates in response to at least one input signal. The two field-effect transistors have their source-drain current paths connected between the output of the dynamic logic circuit and the base of the bipolar transistor.

10 Claims, 8 Drawing Sheets

NUMBER OF SIRIES CONNECTION

FIG. 15

DYNAMIC LOGIC CIRCUIT INCLUDING BIPOLAR TRANSISTORS AND FIELD-EFFECT TRANSISTORS

BACKGROUND OF THE INVENTION

The present invention relates to a clock-synchronization type logic circuit and more specifically to a precharging type logic circuit containing bipolar transistors and field-effect transistors.

Complementary field-effect transistors (or CMOS) have conventionally been utilized to realize high-density integrated circuits with low power consumption. The CMOS circuits may be grouped into two categories: static type and dynamic type. Many very large scale integrated circuits use the dynamic type with smaller number of devices.

Figure 2:
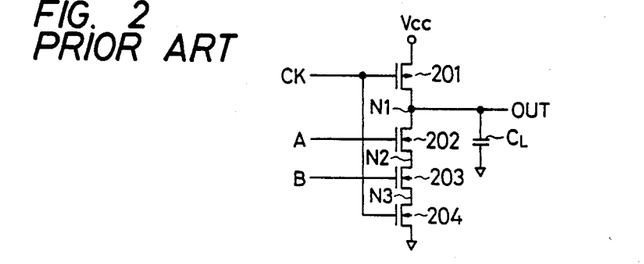
FIG. 2 is a circuit diagram showing the conventional CMOS dynamic circuit.

FIG. 2 shows a circuit configuration of a 2-input NAND circuit, an example of the conventional dynamic logic circuit. In the figure, reference numeral 201 denotes a PMOS transistor, and 202 to 204 NMOS transistors. To the PMOS transistor 201 and NMOS transistor 204 is supplied a clock signal CK and to the NMOS transistors 202, 203 are supplied logic signals A and B, respectively. The output signal OUT is taken from the common connection of the drains of the PMOS transistor 201 and NMOS transistor 202. The capacitance CL to which the output OUT is connected includes the capacitance of wiring and the gate capacitance of the load.

When the clock signal CK is at a "0" level, the PMOS transistor 201 is on and NMOS transistor 204 is off. The output OUT is then precharged to the supply voltage Vcc to become high or arrive at "1" level. In the meantime, if both the input logic signals A and B change to "1" level or go high, the voltage at node N1 will be the supply voltage Vcc and the voltages at nodes N2 and N3 will be Vcc-VthN where the VthN is a threshold voltage of the NMOS transistors 202 and 203. When from this condition the clock signal CK changes from "0" to "1", the PMOS transistor 201 turns off and the NMOS transistor 204 turns on, discharging the charges at the nodes N1 to N3 through the NMOS transistor 204 and causing the output OUT to go low. The relation at that time between the output logic signal OUT and the input logic signal is expressed as follows:

$$OUT = \overline{A \cdot B}$$

Figure 3:
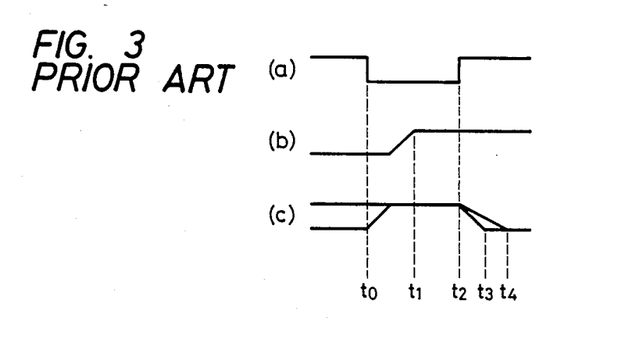
FIG. 3 is a waveform diagram showing the operation of the circuit of FIG. 2.

FIG. 3 is a time chart showing the operation of the circuit of FIG. 2. In FIG. 3, (a) represents the waveform of the clock signal CK, (b) the input logic signals A and B, and (c) the output signal OUT. In the precharge period from time t0 to time t2, the nodes N1 to N3 are precharged to a level "1". With the input signals A and B both at "1", the nodes starts discharging from time t2 after the precharging period. The MOS transistor has a small current drive capability. So, when the load CL is small the discharging finishes during the period from t2 to t3. But with a larger load the discharging time prolongs lasting from t2 to t4. FIG. 2 shows the example of 2-input NAND circuit and the discharging period will become longer as the number of NMOS transistors connected in series increases, as with 3-input NAND circuit and 4-input NAND circuit. The only available means to reduce the discharging period under a given load CL and a given manufacturing process of a device is to increase the width W of the channel of the MOS transistor. This method, however, results in reduced speed of a drive circuit frustrating the initial aim for higher operation speed since the gate capacitance of the MOS transistor increases with the channel width W.

A BiCMOS logic circuit that resolves the drawback of low current drive capability of the MOS transistor and which also has a low power consumption comparable to that of CMOS transistor is proposed in the European Pat. Publication 0099100 (1/1984). This concerns a high speed static logic circuit with the CMOS logic stage consisting of two output stage bipolar transistors for driving a load, a PMOS transistor and an NMOS transistor. This circuit, however, does not consider a dynamic circuit which is a combination of bipolar transistor and field-effect transistor.

As mentioned above, the conventional MOS dynamic circuit has a disadvantage that the response speed reduces as the load increases, which is a major problem in increasing the operation speed. The conventional BiCMOS logic circuits which are all static and thus complicated in circuit configuration are not suited for logic circuits of snychronization type.

SUMMARY OF THE INVENTION

The object of this invention is to provide a dynamic logic circuit including bipolar transistors and field-effect transistors which can realize a precharge type dynamic logic circuit with a small number of devices, capable of high speed operation even with high load.

The first feature of this invention to achieve the above objective lies in that the dynamic logic circuit containing bipolar transistors and field-effect transistors comprises: bipolar transistors having collector, base and emitter with the collector-emitter current path connected between the output of the dynamic logic circuit and a first potential; precharging means which, in response to at least one periodically status-changing clock signal, forms a current path between a second potential and the output of the dynamic logic circuit; and at least one field-effect transistor which, in response to the clock signal and at least one input signal, assumes an on or off state opposite to that of the precharging means, the field-effect transistor having the source-drain current path connected between the output of the dynamic logic circuit and the base of the bipolar transistor.

The second feature of this invention lies in that the dynamic logic circuit containing bipolar transistors and field-effect transistors comprises: bipolar transistors having collector, base and emitter with the collector-emitter current path connected between the output of the dynamic logic circuit and a first potential; precharging means which, in response to at least one periodically status-changing clock signal, forms a current path between a second potential and the output of the dynamic logic circuit; at least one first field-effect transistor which, in response to the clock signal, assumes an on or off state opposite to that of the precharging means; and at least one second field-effect transistor which operates in response to at least one input signal; whereby the first and second field-effect transistors have their source-drain current paths connected between the output of the dynamic logic circuit and the base of the bipolar transistor.

The operation of the dynamic logic circuit may be summarized as follows. When a third field-effect transistor or a precharging means is off, the first field-effect transistor is on. In this condition when the second field-effect transistor logic is established, a base current is made to flow from the output node through the first and second field-effect transistors to the base of the bipolar transistor to turn it on and thereby rapidly discharge the stored charge of the load by the collector current of the bipolar transistor.

Other objects and features of this invention will become apparent during the course of the following descriptions of the embodiments.

DETAILED DESCRIPTION OF THE EMBODIMENTS

Figure 1:
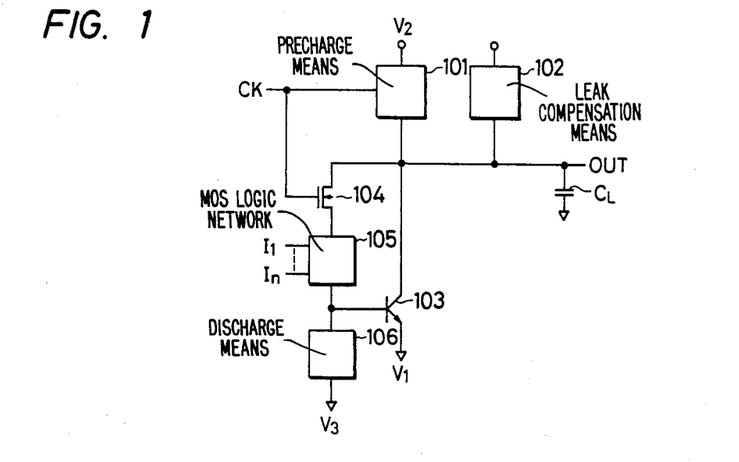
FIG. 1 is a conceptual block diagram of this invention.

FIG. 1 is a conceptional diagram showing the precharge type dynamic circuit of this invention.

In this figure, the element denoted as 101 is a precharging means which, in response to a clock CK, form a current path between a second potential (e.g., supply voltage) V2 and an output OUT and which precharges the output OUT to "1"level. The element denoted as 103 is an NPN bipolar transistor having a collector connected to the output node OUT, an emitter connected to the first potential (e.g., reference earth potential) V1, and collector-emitter current path between the output OUT and the first potential. Reference numeral 104 represents an enhancement type or depletion type NMOS transistor (preferably enhancement type) which serves as the first field-effect transistor. This NMOS transistor is so controlled by the clock CK that the transistor is off when the precharging means 101 is on and it is on when the precharging means is off. The element designated as 105 is an NMOS transistor of enhancement type or depletion type (preferably enhancement type) which forms the second field-effect transistor and which numbers N (N≧1). When the NMOS transistor consists of one transistor (N=1), it forms an inverter logic circuit. When it consists of more than 1 (N≧2), it forms a logic circuit network of the transistors connected in series or in parallel or in combination of both, the logic circuit network being controlled on and off by N input logic signals I1 to In.

The source-drain current paths of the first and second field-effect transistors 104 and 105 are connected between the output OUT and the base of the bipolar transistor 103. When the two field-effect transistors are both turned on, the base current flows from the output OUT through the first field-effect transistor 104 and second field-effect transistor 105 into the bipolar transistor 103, turning the bipolar transistor 103 on. As a result, a collector current $\beta$ times the base current ($\beta$: current gain) flows through the NPN bipolar transistor 103. This causes the charged load CL to rapidly discharge bringing the output OUT to "0" level. The logic relationship between the output OUT and the inputs I1 and In at this time is give by $$\text{OUT} = \overline{Ck \cdot f(I1, I2, \ldots, In)}$$

The element denoted as 102 is a leak compensation means to prevent the level of the output OUT from falling due to leak current flowing from the output OUT to the first potential V1 when both the precharging means 101 and the NPN bipolar transistor 103 are off. The leak current between the colletor and the emitter of the bipolar transistor 103 is large as compared with the leak current of the MOS transistor. This is why the dynamic circuit of this invention is provided with the leak compensation means.

The element denoted as 106 is a means for discharging the charges stored in the base of the bipolar transistor 103. The discharging means rapidly discharges the base-stored charge to the third potential (preferably almost equal to the first potentials) when the NPN bipolar transistor 103 turns off, thereby quickening the turn-off time. It is well known that the discharging means can be formed of various kinds of circuits such as a passive resistor or an active resistor employing a MOS transistor, and in the following embodiments the detail of the discharging means will not be described unless necessary.

Figure 4:
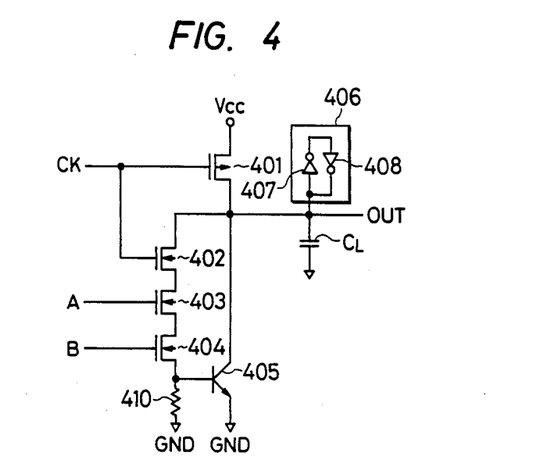
FIG. 4 is a circuit diagram showing the dynamic 2-input NAND circuit, the first embodiment of this invention.

FIG. 4 is a circuit diagram showing the first embodiment of this invention. In FIG. 4, 401 is an enhancement type PMOS transistor (the following description deals with the enhancement type) which is a third field-effect transistor for precharging. The source of this transistor is connected to a supply potential Vcc or a second potential, the drain to the output node OUT and the gate to the clock signal CK. 402 is an NMOS transistor which is a first field-effect transistor with its drain connected to the output node OUT, its gate to the clock signal CK and its source to the drain of the NMOS transistor 403. NMOS transistors 403, 404 which are second field-effect transistors are connected in series, with their gates applied with input signals A, B and with the source of the NMOS transistor 404 connected to the base of the NPN bipolar transistor 405. The NPN bipolar transistor 405 has its collector connected to the output OUT and the emitter to the first potential or the reference potential GND. Between the output OUT and the base of the NPN bipolar transistor 405 are connected a series of MNOS transistors 402, 403, 404.

406 is a leak compensation means which in this embodiment is formed of a positive feedback type latch circuit consisting of inverters 407, 408.

A discharging means 410 is a resistor which discharges the base-stored charge to the GND or a third potential V3 when the NPN bipolar transistor changes its state from on to off.

Now, when the clock signal CK is "0", the NMOS transistor 402 is off and thus no current is applied to the base of the NPN bipolar transistor 405, holding the transistor 405 in off state. On the other hand, the PMOS transistor 401 is on, charging the capacitive load CL to the supply voltage Vcc.

Next, when the clock signal CK becomes "1", the PMOS transistor 401 turns off and the NMOS transistor 402 turns on. When at least one of the input signals A, B is "0", at least one of the NMOS transistor 403, 404 is off. That is, no current flows to the base of the NPN bipolar transistor 405 which remains off. Thus, at this time the voltage at the output node OUT is almost at the level of supply voltage Vcc.

When the input signals A and B are both "1", both of the NMOS transistors 403 and 404 are on supplying current from the output node OUT through the source-drain path of the NMOS transistors 402, 403, 404 to the base of the NPN bipolar transistor 405, turning the NPN bipolar transistor 405 on. As a result, the charge of the load CL is discharged by the collector current of the NPN bipolar transistor 405, bringing the output OUT of the dynamic circuit to "0" level.

Figure 5:
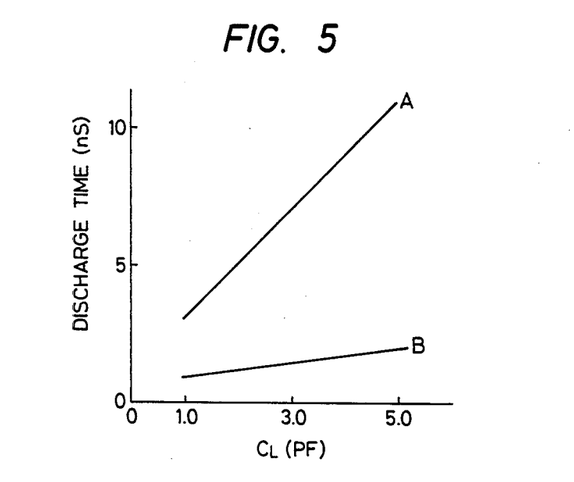
FIG. 5 is a discharging time characteristic diagram for the circuit of FIGS. 2 and 3.

FIG. 5 shows a result of analysis on delay time of the conventional dynamic circuit of FIG. 2 and of the dynamic circuit of this invention by using a circuit simulator. In FIG. 5, A and B represent the characteristic of the conventional circuit and that of this invention respectively. It is seen that even at high load the circuit of this invention has a smaller increase in delay time.

In the drawings for subsequent embodiments of this invention, the leakage compensation means and discharging means are not shown.

The bipolar transistor used on this embodiment may preferably be a high-performance vertical NPN transistor made up of bipolar and CMOS transistors formed on a single semiconductor substrate by the integration process, such as the high speed BiCMOS VLSI technology with buried twin well structure which is proposed by A. Watanbe et al (introduced in IEDM '95 Dec., 1985, p423-426). With bipolar transistors with low transit frequency such as lateral NPN transistor that can be manufactured by the conventional CMOS process, it is impossible to achieve a higher operation speed, which is one of the objectives of this invention.

Figure 6:
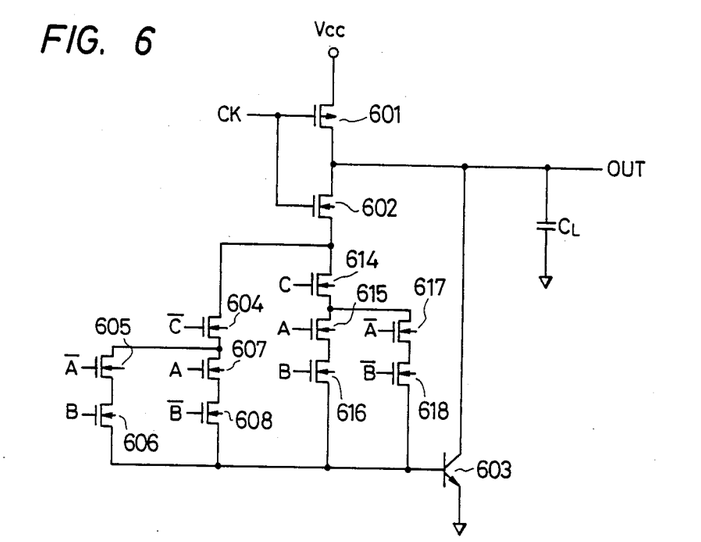
FIG. 6 is a circuit diagram showing a half-adder circuit, the second embodiment of this invention.

FIG. 6 is a circuit diagram showing the second embodiment of this invention.

In FIG. 6, denoted 601 is a PMOS transistor or a third field-effect transistor constituting a precharging means with its source connected to the power supply potential Vcc or a second potential, the gate to the clock signal CK and the drain to the output OUT. 602 indicates an NMOS transistor or a first field-effect transistor with its drain connected to the output OUT, the gate to the clock signal CK and the source to the drains of NMOS transistors 604, 614. The NMOS transistors 604, 605, 606, 607, 608, 614, 615, 616, 617, 618 form a group of the second field-effect transistors.

The source of the NMOS transistor 604 is connected to the drains of the NMOS transistors 605, 607. The NMOS transistors 605 and 606 are connected in series and the source of the NMOS transistor 606 is connected to the base of the NPN bipolar transistor 603. Similarly, the NMOS transistors 607 and 608 are connected in series and the source of the NMOS transistor is led to the base of the NPN bipolar transistor 603.

The source of the NMOS transistor 614 is connected to the drains of the NMOS transistors 615, 617. The NMOS transistors 615 and 616 are connected in series, with the source of the NMOS transistor 616 connected to the base of the NPN bipolar transistor 603. Likewise, the NMOS transistors 617 and 618 are connected in series, with the source of the NMOS transistor 618 connected to the base of the NPN bipolar transistor 603. The NMOS transistors 604 to 608 and 614 to 618 are each applied at their gates with input signals A, B, C and their inverted signals $\overline{A}$, $\overline{B}$, $\overline{C}$, as shown.

The circuit of this embodiment has a function of half-adder and the relation between the output OUT and the input signals A, B, C is given by $$OUT = \overline{CK \cdot C \cdot (A \oplus B) + CK \cdot \overline{C} \cdot (A \oplus B)}$$

That is, when the clock signal CK is at a level of, say, "0", the output OUT is charged up to the supply voltage Vcc to reach the "1" level.

Next, let us consider the case where the clock signal CK is "1" and the input signal C=0. When in this condition A=0 and B=1, the NMOS transistors 602, 604, 605, 606 are turned on; or when A=1 and B=0, the NMOS transistors 602, 604, 607, 608 are turned on. Then the source-drain current path is formed between the output OUT and the base of the NPN bipolar transistor 603, turning on the NPN bipolar transistor 603 and bringing the output OUT to "0" level. In the case of CK=1 and C=1, when A=1 and B=1, the NMOS transistors 602, 614, 615, 616 are turned on; or when A=0 and B=0, the NMOS transistors 602, 614, 617, 618 are turned on. Thus, the source-drain current path is formed between the output OUT and the base of the NPN bipolar transistor 603, turning on the transistor 603 and bringing the out OUT to "0" level. At the same time, the charge of the output OUT is rapidly discharged by the high current drive capability of the NPN bipolar transistor 603.

Figure 7:
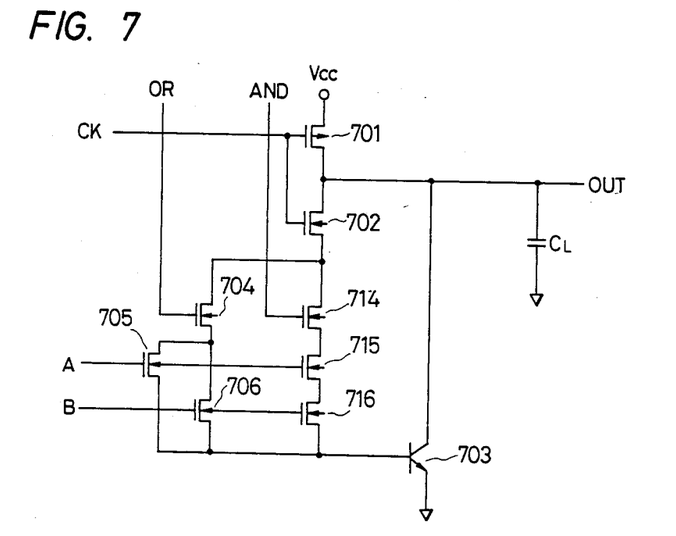
FIG. 7 is a circuit diagram showing the logic calculation circuity, the third embodiment of this invention.

FIG. 7 is a circuit diagram showing the third embodiment of this invention.

In FIG. 7, denoted 701 is a PMOS transistor or a third field-effect transistor constituting the precharging means, with the source connected to the supply potential Vcc or a second potential, the gate to the clock CK and the drain to the output OUT. 702 denotes an NMOS transistor or a first field-effect transistor with the drain connected to the output OUT, the gate to the clock CK and the source to the drains of NMOS transistors 704 and 714. NMOS transistors 704, 705, 706, 714, 715, 716 form a group of second field-effect transistors. 703 represents an NPN bipolar transistor with the collector connected to the output OUT and the emitter to the reference potential GND or a first potential. The NMOS transistor 704 has its gate connected to the control signal OR and its source to the drains of the NMOS transistors 705 and 706. The NMOS transistors 705 and 706 are connected in parallel with each other with their gates applied with inputs A and B respectively and with their sources connected to the base of the NPN bipolar transistor 703. The NMOS transistor 714 has its gate connected to the control signal AND and the source to the drain of the NMOS transistor 715. The NMOS transistors 715 and 716 are connected in series with each other with their gates applied with input signals A and B and with the source of the NMOS transistor 716 connected to the base of the NPN bipolar transistor 703.

This circuit has two kinds of logical operation functions, i.e., OR and AND, and the relation between the output OUT and the input signals A and B is expressed by $$OUT = \overline{CK \cdot OR \cdot (A+B)} + \overline{CK \cdot AND \cdot (A \cdot B)}$$

That is, when the clock signal CK is "0", the PMOS transistor 701 is on and the NMOS transistor 702 is off. And no current is supplied to the base of the NPN bipolar transistor 703 which is then off. Thus, the output OUT is charged to the supply potential Vcc to become "1" regardless of the state of the input signals A and B or the control signals AND and OR.

Next, when the clock signal CK=1 and the control signal OR=1 and when either the input signal A or B is 1, the NMOS transistors 702 and 704 are turned on and one of the NMOS transistors 705 and 706 is turned on. As a result, a source-drain current path is formed between the output OUT and the base of the NPN bipolar transistor 703, supplying current from the output OUT to the base of the NPN bipolar transistor 703, turning the transistor 703 on and bringing the output OUT to "0" level.

When the clock signal CK=1 and the control signal AND=1 and when both of the input signals A and B are "1", the NMOS transistors 702, 714, 715, 716 are turned on, forming the source-drain current path between the output OUT and the base of the NPN bipolar transistor 703, supplying current from the output OUT to the base of the NPN bipolar transistor 703, turning the transistor 703 on and bringing the output OUT to "0" level. If the NMOS transistor 702 is removed, the same logical operation can be obtained if the control signals OR and AND are applied while the clock CK is "1".

Figure 8:
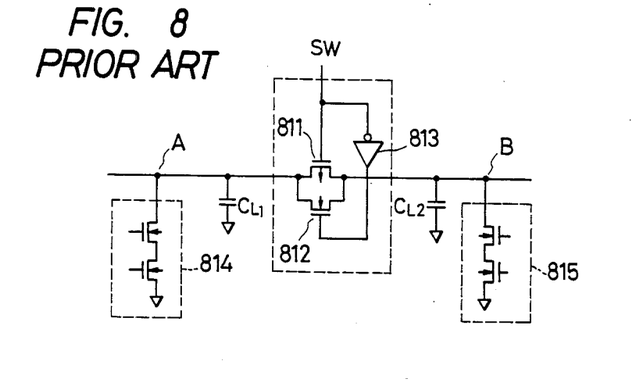
FIG. 8 is a circuit diagram showing the conventional bus switch circuit.

FIG. 8 shows the conventional bus switch circuit using the field-effect transistors. In FIG. 8, designated 811 is a PMOS transistor with the source (or drain) connected to one bus A, the drain (or source) to another bus B and the gate to the control signal SW. 812 is an NMOS transistor with the source (or drain) connected to one bus A, the drain (or source) to the other bus B and the gate to the control signal SW inverted by an inverter 813 which is formed of CMOS device. 814 is a discharging circuit on the bus A side and 815 a discharging circuit on the bus B side.

Let us consider the case of transferring data from the bus A side to the bus B side. The operation will be as follows.

When, with the bus A and bus B precharged to "1" level, the bus switch signal SW is energized, the PMOS transistor 811 and NMOS transistor 812 are both turned on connecting the bus A and the bus B. In this condition, if the discharging circuit 814 on the bus A side is off, the level of the bus A side remains at "1" so that the level of the bus B side also remains at "1". This is equivalent to making transfer of "1" level. On the other hand, if the discharging circuit 814 is on, the charge of CL1 on the bus A side is discharged through the discharging circuit 814. The charge of CL2 on the bus B side passes through the PMOS transistor 811 and NMOS transistor 812 and discharged, and consequently the level on both sides becomes "0".

The disadvantage of the conventional method is that since the discharging means is formed of MOS transistors with small current drive capability, it is not only unable to discharge at high speed the bus with high load but also has to discharge the charge on the other bus through the bus switch. This takes a very large discharging time making it impossible to perform high speed bus switching operations.

Figure 9:
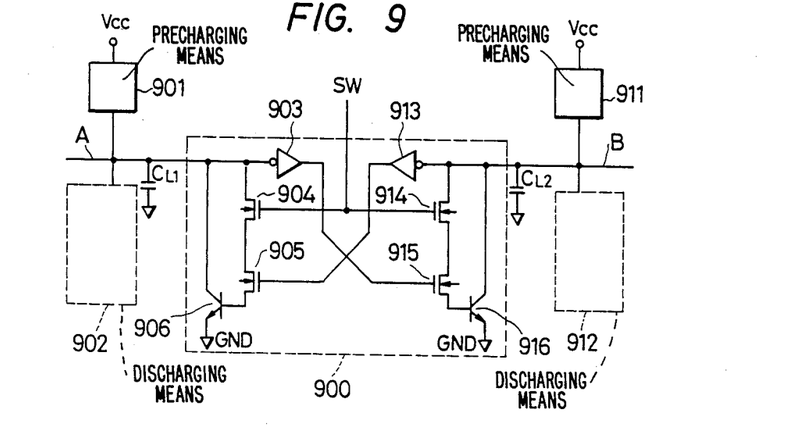
FIG. 9 is a circuit diagram showing a bus switch circuit, the fourth embodiment of this invention.

FIG. 9 is a circuit diagram showing the fourth embodiment of this invention. The circuit shown in FIG. 9 preferably forms a part of data processing apparatus such as microprocessor which is integrally manufactured on a single semiconductor substrate.

FIG. 9 shows an example of the bus switch circuit to transfer data between two or more precharge type buses. This circuit comprises: precharging means for charging the buses to high level in response to clock; leakage current compensation means connected to each bus; first NMOS transistor switch means which are off when the precharge means are on and which are turned on by a bus switch control signal applied to the gate at a specified timing during the precharging means off period; second MOS transistor means which are turned on and off by an inverted level of source bus applied to the gate; and NPN bipolar transistors with the collector connected to the destination bus and the emitter to the reference potential, the first and second NMOS transistor switch means being connected in series between the destination bus and the base of the NPN bipolar transistor; whereby when the first and second NMOS transistor switch means are both on, the base current is made to flow through the first and second NMOS transistor switch means into the NPN bipolar transistors to turn them on and thereby discharge the charge of the destination buses—which were charged to high level by the precharging means—mainly by the collector current.

In FIG. 9, designated 901 is a precharging circuit for the bus A; 902 is a discharging circuit for the bus A; 903 is an inverter to invert the level of the bus A; 904 is an NMOS switch or the first field-effect transistor which is turned on and off by the control signal SW; 905 is an NMOS transistor switch or the second field-effect transistor which is turned on and off by the inverted bus B level signal; and 906 is an NPN bipolar transistor with the collector connected to the bus A and the emitter to the reference potential GND or the first potential. The NMOS transistors 904 and 905 are connected in series between the bus A and the base of NPN bipolar transistor 906.

911 denotes a precharging circuit for the bus B; 912 a discharging circuit for the bus B; 913 an inverter to invert the bus B level; 914 and NMOS transistor switch which is turned on and off by the control signal SW which is one of the clock signals; 915 an NMOS transistor switch which is turned on and off by the inverted bus A level signal; and 916 an NPN bipolar transistor with the collector connected to the bus B and the emitter to the reference potential. The NMOS transistors 914 and 915 are connected in series between the bus B and the base of the NPN bipolar transistor 916.

Consider the case where data is transferred from the bus A side to the bus B side. The operation is as follows:

When, with the bus A and bus B precharged to "1" level, the bus switch signal SW is energized, the NMOS transistors 904 and 914 are turned on. In this condition, if the discharging circuit 902 on the bus A side is off, the level of the bus A remains "1" and the ouput of the inverter 903 is "0" level leaving the NMOS transistor 915 turned off. Thus, the NPN bipolar transistor 916 is off with the bus B level remaining "1". This is equivalent to transfer of "1" level to the other bus side.

On the other hand, if the discharging circuit 902 is on, the charge of the load CL1 on the bus A side is discharged through the discharging circuit 902, with the result that the output of the inverter 904 changes to "1" level, turning on the NMOS transistor 915. This turns on the NMOS transistors 914 and 915, forming a source-drain current path between the bus B or output and the base of the NPN bipolar transistor 916. As a result, the charge of CL2 on the bus B side is discharged by the collector current of the NPN bipolar transistor 916 thereby quickly switching the bus B to "0" level. At the same time, the output of the inverter 913 switches to "1" level, turning on the NMOS transistor 905. Thus, the source-drain current path made up of the NMOS transistors 904 and 905 is formed between the bus A or output and the base of the NPN bipolar transistor 906, turning on the NPN bipolar transistor 906 further accelerating the discharging of the bus A by the collector current of the NPN bipolar transistor 906.

As can be seen from the above explanation, with the bus switch circuit of this invention, when the source bus level switches to "0" level, that level switching is detected to turn on the NMOS transistors 904 and 914 and also the NPN bipolar transistors 906 and 916 connected to the destination buses, so that the bus even with high load can be discharged at high speed by the high current drive capability of the NPN bipolar transistors. Furthermore, the discharging means of the source side need only discharge the charge on the source side, which results in a substantial improvement in the operation speed over the conventional bus switch circuit.

In this embodiment, the data transfer between the two buses can be made in either direction. If the data transfer is to be made only from the bus A to the bus B, the inverter 913, NMOS transistors 904 and 905 and NPN transistor 906 are not necessary. It is also possible to make an arbitrary combination of the number of source buses and destination buses.

Figure 10:
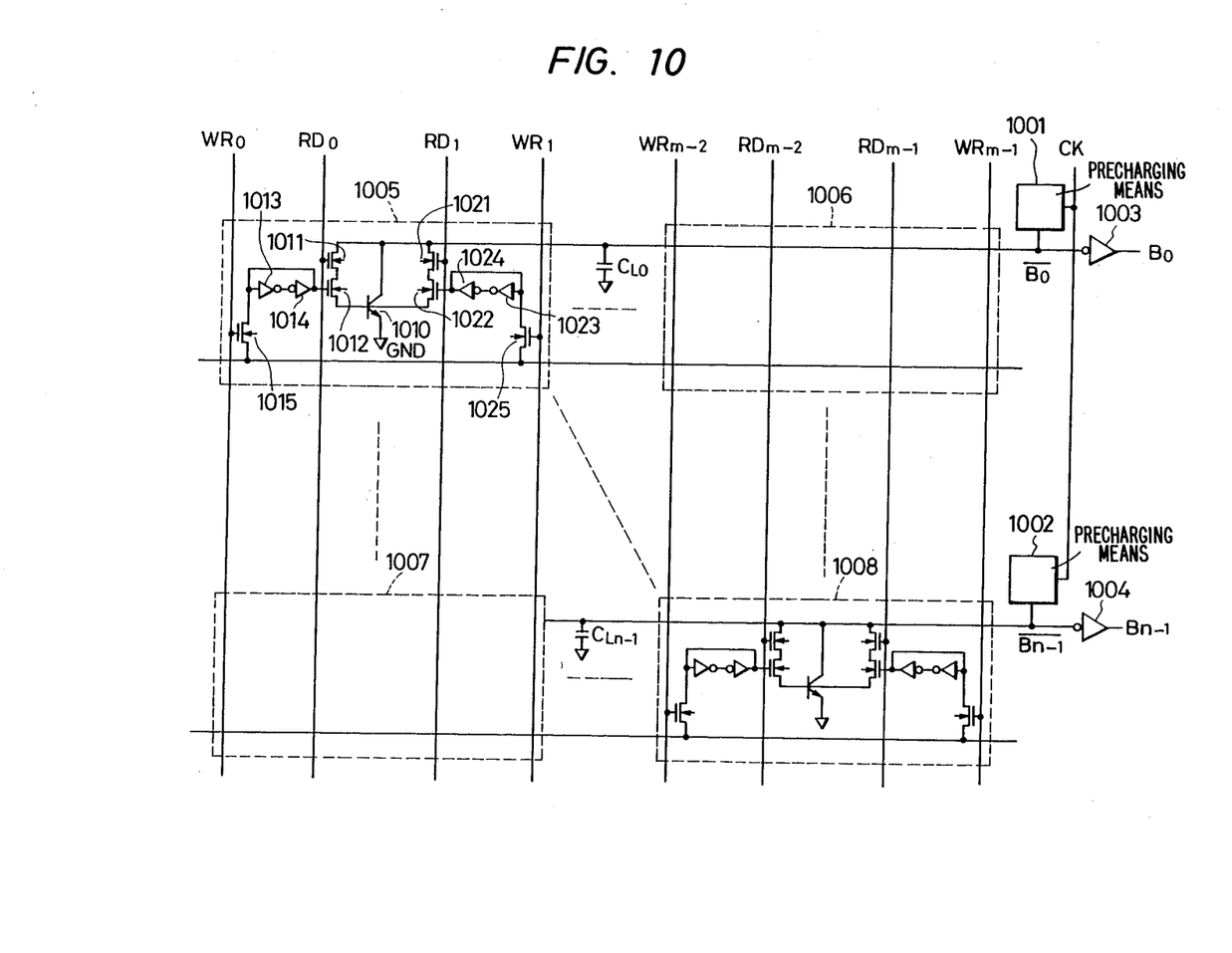
FIG. 10 is a circuit diagram showing a register device, the fifth embodiment of this invention.

FIG. 10 shows the fifth embodiment of this invention which is an m-word-by-n-bit register with a static memory.

The register shown in FIG. 10 preferably forms a part of data processing apparatus such as microprocessor integrated on a single semiconductor substrate.

The register comprises: precharging means which in response to clock signals precharge each of n output bit lines to high level; leakage current compensation means (not illustrated) connected to each of the output bit lines; first NMOS transistor switch means which are off when the precharging means are on and which are turned on and off by a read signal applied for each word at a specified timing during the precharging means off period; second NMOS transistor switch means which are turned on and off according to the output level of the memory cell; and NPN bipolar transistors with the collectors connected to the output bit lines and emitters to the reference potential, the first and second NMOS transistor switch means being connected in series between the output bit lines and the bases of the NPN bipolar transistors; whereby when both of the first and second NMOS transistor switch means are on, the base current is made to flow from the output bit lines through the first and second NMOS transistor switch means to the NPN bipolar transistors to turn them on and thereby discharge the charge of the output bit lines—which were charged to high level by the recharging means—mainly by the collector current of the NPN bipolar transistors.

In FIG. 10, the first and second NMOS transistor switch means are provided for each bit of memory and the NPN bipolar transistors are provided one for a plurality of words on one and the same bit line.

Reference numerals 1001 and 1002 represent precharging means connected to the bit lines $\overline{B0}$ to $\overline{Bn-1}$. Denoted 1003 and 1004 are CMOS inverters. 1005 to 1008 each constitute a two-bit memory cell provided for each two words. In the memory cell 1005, an NPN bipolar transistor 1010 has its collector connected to the bit line $\overline{B0}$ and its emitter to the reference potential. NMOS transistors 1011 and 1012 are connected in series between the bit line $\overline{B0}$ and the base of the NPN bipolar transistor 1010. The NMOS transistor 1011 which is the first field-effect transistor has its gate connected to the read signal RD0 and the NMOS transistor 1012 which is the second field-effect transistor has its gate connected to the output of the flip-flop made up of inverters 1013 and 1014. The NMOS transistor 1015 has its source (or drain) connected to the data line D0, the drain (or source) to the input of inverter 1013 and to the output of inverter 1014, and the gate to the write signal WR0.

Similarly, NMOS transistors 1021 and 1022 are connected in series between the bit line $\overline{B0}$ and the base of the NPN bipolar transistor 1010. The MNOS transistor 1021 has its gate connected to the read signal RD1 and the NMOS transistor 1022 has its gate connected to the output of the flip-flop made up of CMOS inverters 1023 and 1024. The NMOS transistor 1025 has its source (or drain) connected to the data line D0, the drain (or source) to the input of inverter 1023 and to the output of inverter 1024, and the gate to the write signal WR1.

The write operation on this register is as follows. The data lines D0 to Dn−1 are given an n-bit data to be written. Energizing one of the write control signals WR0 to WRm−1 causes the n-bit data to be written into a specified one of m words. Now, consider the case where the write control signal WR0 is energized. The NMOS transistor 1015 is turned on to write the contents of the data line D0 into the flip-flop, made up of inverters 1013 and 1014, where it is held. Likewise, when WR1 is energized, the NMOS transistor 1025 is turned on to write the contents of the data line D0 into the flip-flop, made up of inverters of 1023 and 1024, where it is held.

The read operation on this register is as follows. The bit lines $\overline{B0}$ to $\overline{Bn-1}$ are precharged prior to reading operation. Energizing one of the read control signal RD0 to RDm−1 causes a desired word from among m words to be read onto the bit lines $\overline{B0}$ to $\overline{Bn-1}$. The inverters 1003 and 1004 then produce inverted outputs of the bit line data.

Let us consider the case where a read signal RD0, one of the clock signals, is energized. The NMOS transistor 1011 is turned on and the NMOS transistor 1012 is given the output of the inverter 1014 and is turned on. When the output of the inverter 1014 is "0", the NMOS transistor 1012 is off and the NPN bipolar transistor 1010 is also off. At this time, the bit line $\overline{B0}$ remains charged and the inverter 1003 produces "0" output. When the output of the inverter 1014 is "1", the NMOS transistor 1012 is turned on. As the NMOS transistors 1011 and 1012 are turned on, a source-drain current path is formed between the bit line $\overline{B0}$ or an output and the base of the NPN bipolar transistor 1010, turning the NPN bipolar transistor 1010 on. Thus, the charge of the load CL0 connected to the bit line $\overline{B0}$ is discharged by the collector current of the NPN bipolar transistor 1010 switching the bit line $\overline{B0}$ to "0" level. As a result, the inverter 1003 produces "1" output.

The case where the read signal RD1 is energized also has the similar operation with the NMOS transistors 1021 and 1022 and the explanation on this case is omitted.

Figure 11:
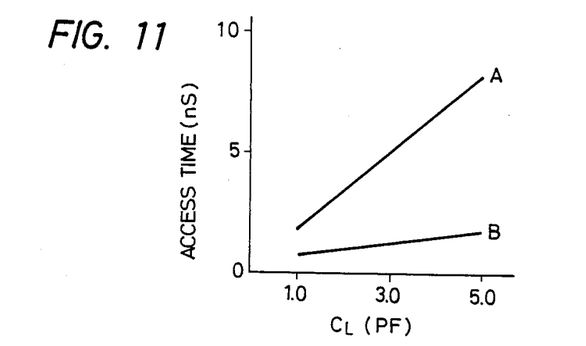
FIG. 11 is a time chart showing the access time for the register.

FIG. 11 shows the access time in the reading operation of the register of this invention, which was analyzed by a circuit simulator and plotted with the bit line load varied.

In FIG. 11, A represents the access time for the conventional registers while B represents the access time for the register of this invention. The device constants used in simulation are as follows.

Channel width W=12 μm for NMOS transistors 1011 and 1012;

Channel length L=1.2 μm for NMOS transistors 1011 and 1012;

Emitter size AE=1.2×3.0 μm² for NPN bipolar transistor 1010; and

Cutoff frequency $f_T$=6 GHz for NPN bipolar transistor 1010.

As is seen from the diagram, the increase in the access time of the register of this invention that occurs as the bit line load increases is small compared with the conventional register; and more specifically, the access is approximately four times faster than CL=5PF.

Although in this embodiment the NPN bipolar transistors are provided one for each two bits, it is also possible to take any other arbitrary combinations of bits such as one for each four bits or for each eight bits. By reducing the number of bipolar transistors in this way it is possible to obtain a slight increase in area and thereby realize a higher speed access so far unachievable with the conventional registers.

Figure 12:
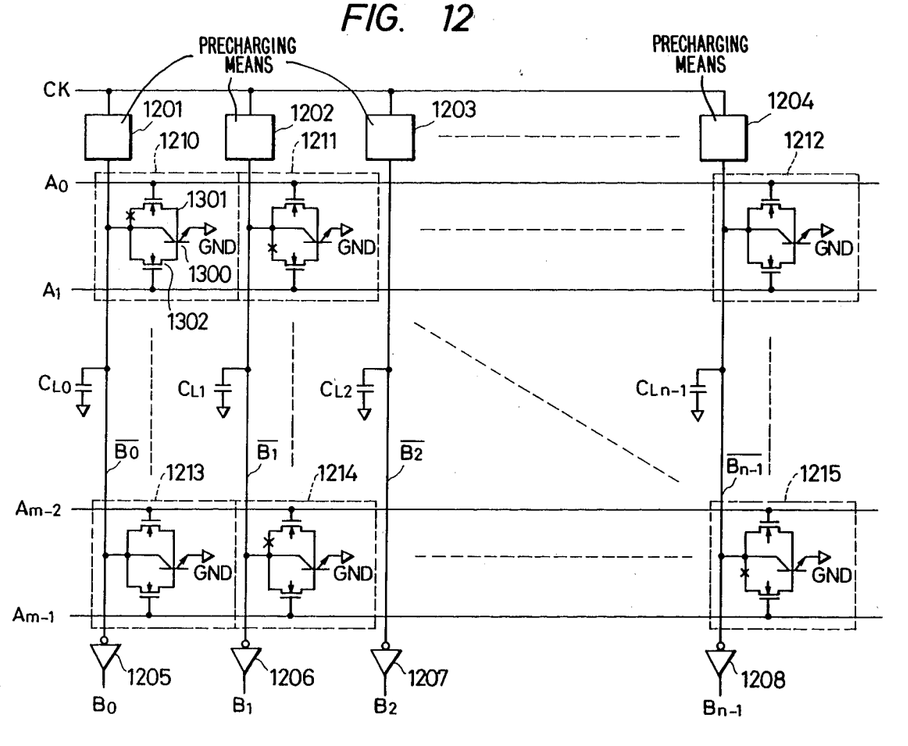
FIG. 12 is a circuit diagram showing a ROM, the sixth embodiment of this invention.

FIG. 12 shows the sixth embodiment of this invention which is an m-word-by-n-bit configuration dynamic ROM (read only memory).

The ROM shown in FIG. 12 preferably forms a part of data processing apparatus such as microprocessor integrated in a single semiconductor substrate. This dynamic ROM comprises: precharging means which in response to the clock signals charge n bit lines to high level; leakage current compenstion means (not illustrated) connected to each of the bit lines; and memory cells each consisting of an NPN bipolar transistor and NMOS transistor switch means, the NPN bipolar transistor having the collector connected to the bit line and the emitter to the reference potential to represent either "1" or "0" state of the memory cell, the NMOS transistor switch means having the gates connected to the word lines and the drains and sources connected between the bit line and the base of the NPN bipolar transistor; whereby when the word line connected to the gate of the NMOS transistor switch means is energized, the base current is made to flow from the output bit line to the NMOS transistor switch means to turn it on thereby discharging the charge of the output bit line—which was charged by the precharging means to high level—mainly by the collector current of the NPN bipolar transistor.

In FIG. 12, denoted 1201 to 1204 are precharging means connected to the bit lines $\overline{B0}$ to $\overline{Bn-1}$; 1205 to 1208 CMOS inverters; and 1210 to 1215 2-bit memory cells provided one for each two words. In the memory cell 1210, reference number 1300 is an NPN bipolar transistor with its collector connected to the bit line $\overline{B0}$ and emitter to the reference potential. 1301 and 1302 are NMOS transistors each constituting one-bit memory unit. Here it is defined that the NMOS transistors' state is "1" when these NMOS transistors' sources and drains are connected between the bit line $\overline{B0}$ and the base/collector of the NPN bipolar transistor 1300, and that the state is "0" when they are not. The NMOS transistor 1301 that doubles as the first and second field-effect transistors has its gate connected to the word line A0 and the source to the base of the NPN bipolar transistor 1300. But its drain is not connected to the bit line $\overline{B0}$ (as shown by a mark "X"), so that the NMOS transistor 1301 keeps "0" level. The NMOS transistor 1302 which doubles as the first and second field-effect transistors has its gate connected to the word line A1, the drain to the bit line B0, and the source to the base of the NPN bipolar transistor 1300. So the NMOS transistor 1302 keeps "1" level.

The read operation on the ROM of this invention is performed as follows. The bit lines $\overline{B0}$ to $\overline{Bn-1}$ are precharged by the precharging means 1201 to 1204 prior to the read operation. Then energizing one of the word lines A0 to Am−1 causes the contents of a desired word from among m words to be read onto the bit lines $\overline{B0}$ to $\overline{Bn-1}$ and the inverters 1205 to 1208 produce inverted outputs of the bit line data.

Let us consider the operation of the memory cell 1210 when the word line A0 is energized. Since the NMOS transistor 1301 keeps data "0", the NPN bipolar transistor 1300 is off. Thus, the data line $\overline{B0}$ remains charged and the inverter 1205 produces "0" output. Next, when the word line A1 is energized, the NPN bipolar transistor 1300 is turned on because the NMOS transistor 1302 keeps "1". Thus, the charge of the load CL0 connected to the bit line $\overline{B0}$ is discharged by the collector current of the NPN bipolar transistor 1300, switching the bit line $\overline{B0}$ to "0" and producing "1" output from the inverter 1205.

While in this embodiment the NPN bipolar transistors are provided one for each two bits, it is also possible to take any arbitrary combinations of bits such as providing one NPN bipolar transitor for each four bits or for each eight bits. By reducing the number of bipolar transistors in this way it is possible to obain a slight increase in area and thereby realize a higher speed access so far unachievable with the conventional ROM.

In FIG. 12, it is preferred that one NMOS transistor switch means be provided for each of the states "1" and "0" of the memory cell and that one NPN bipolar transistor be provided for a plurality of words on one and the same bit line.

Figure 13:
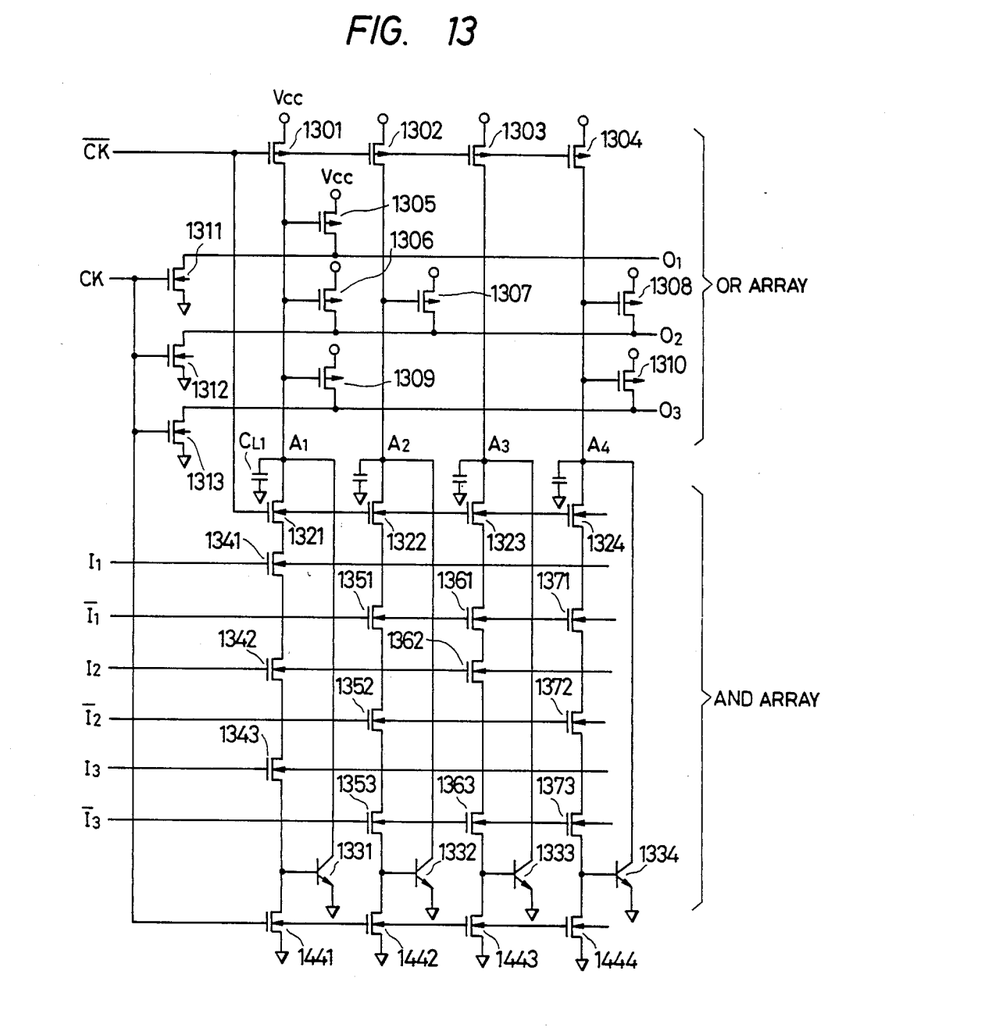
FIG. 13 is a circuit diagram showing a PLA, the seventh embodiment of this invention.

FIG. 13 shows the seventh embodiment of this invention which is a dynamic PLA (programmable logic array). The dynamic PLA shown in FIG. 13 forms a part of data processing apparatus such as microprocessor integrated in a single semiconductor substrate.

The dynamic PLA of this embodiment comprises: precharging means which is response to the clock signals charge the outputs of the AND array to high level; leakage current compensation means (not illustrated) connected to the outputs of the AND array; discharging means for discharging the outputs of the OR array to low level; first NMOS transistor switch means which are off when the precharging means and the discharging means are both energized or active and which are turned on at a specififed timing during a period in which both the precharging means and the discharging means are deenergized; one or more second NMOS transistor switch means connected in series for AND operation; and NPN bipolar transistors with their collectors connected to the outputs of the AND array and emitters to the reference potential, the first and second NMOS transistor switch means being connected in series between the outputs of the AND array and the bases of the NPN bipolar transistors; whereby when both the first and second NMOS transistor switch means are on, the base currents are made to flow from the outputs of the AND array through the first and second NMOS transistors switch means to the NPN bipolar transistors to turn them on and thereby discharge the charge at the outputs of the AND array—which were charged to high level by the precharging means—mainly by the collector currents of the NPN bipolar transistors.

FIG. 13 shows an example of PLA with three inputs, three outputs and four AND terms.

In FIG. 13, 1301 to 1304 represent PMOS transistors or third field-effect transistors to precharge the outputs A1 to A4 of the AND array. These PMOS transistors are on when the first clock signal $\overline{CK}$ is "0" and off when the clock signal $\overline{CK}$ is "1". 1311 to 1313 are NMOS transistors to discharge the output lines $\overline{O1}$ to $\overline{O3}$. The NMOS transistors 1311 to 1313 are on when the second clock signal CK is "1" and off when it is "0". 1321 to 1324 are isolating NMOS transistor switches (first field-effect transistors) which are off when the first clock signal $\overline{CK}$ is "0", i.e., while the outputs A1 to A4 of the AND array are precharged, and which are on when the second clock signal CK is 1. 1331 to 1334 are NPN bipolar transistors with their collectors connected to the outputs A1 to A4 of the AND array and emitters to the reference potential. NMOS transistors for AND operation 1341-1343, 1351-1353, 1361-1363, 1371-1373 which form the second field-effect transistors are connected in series with the corresponding isolating NMOS transistors 1321 to 1324 and between the base of the NPN bipolar transistors 1331-1334 and the outputs A1 to A4 of the AND array. In more detail, the collector of the NPN bipolar transistor 1331 is connected to the output A1 of the AND array; and the isolating NMOS transistor 1321 and the AND operation NMOS transistors 1341-1343 are connected between the output A1 of the AND array and the base of the NPN bipolar transistor 1331.

NMOS transistors 1441 to 1444 are to discharge the charge stored in the base of the NPN bipolar transistors 1331 to 1334 and are on when the clock signal CK is "1".

Now, the operation of this circuit will be described centering around the output line $\overline{O1}$. When the first clock signal $\overline{CK}$ is "0" and the second clock signal CK is "1", the PMOS transistor 1301 is turned on and the isolating NMOS transistor 1321 is turned off, so that the output A1 of the AND array is precharged to the potential Vcc. At this time, PMOS transistor 1305 is turned off. When the second clock signal CK is "1", the discharging NMOS transistor 1311 is also turned on and the output $\overline{O1}$ goes low.

Next, when the first clock signal $\overline{CK}$ changes to "1" and the second clock signal CK to "0", the PMOS transistor 1301 and the NMOS transistor 1311 both turn off and the NMOS transistor 1321 turns on. At this time, the AND operation NMOS transistors 1341-1343 are turned on or off according to the levels of input signals I1 to I3.

Now, when at least one of the input signals I1 to I3 is low or "0", at least one of the NMOS transistors 1341-1343 is off with the result that no current flows to the base of the NPN bipolar transistor 1331 keeping the NPN bipolar transistor 1331 turned off. Thus, the output A1 of the AND array remains charged to the referenced potential Vcc or the second potential and the PMOS transistor 1305 also remains off. As a result, the output $\overline{O1}$ produces "0" level.

Next, when all the input signals I1 to I3 are high or "1", the NMOS transistors 1341-1343 are all turned on, causing the base current to flow from the output A1 of the AND array through the source-drain current path of the NMOS transistor 1321 and the NMOS transistors 1341-1343 and to the base of the NPN bipolar transistor 1331, turning the transistor 1331 on. As a result, the charge at the output A1 of the AND array is quickly discharged by the collector current of the NPN bipolar transistor 1331, switching the output A1 to the low level or "0" level. This in turn turns on the PMOS transistor 1305 switching the output 01 to the Vcc potential. It is seen from the above operation that when the first clock signal $\overline{CK}$ is "1", the relation between the output $\overline{O1}$ and the inputs I1 to I3 is given by $$\overline{O1} = A1 \cdot A2 \cdot A3$$

The conventional PLA was difficult to achieve a significant increase in operation speed, because the number of AND operation NMOS transistors connected in series increases with the number of inputs and therefore the time required to discharge the output of the AND array also becomes large in proportion to the number of inputs. With this embodiment, however, although the increase in the number of NMOS transistors connected in series results in reduction in the base current of the NPN bipolar transistor, the base current is amplified by the NPN bipolar transistor so that an increase in the time to discharge the AND array output is very small.

Figure 14:
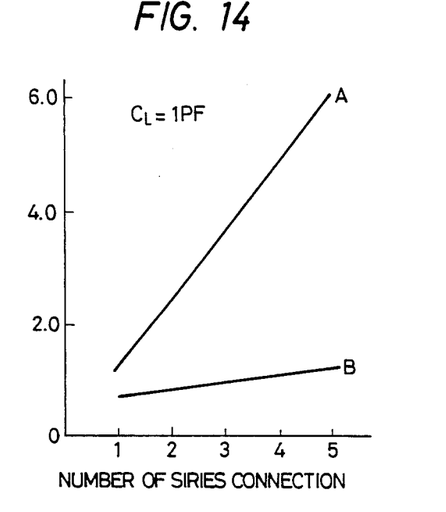
FIG. 14 is a diagram showing the discharging time characteristic of the series MOS.

FIG. 14 shows the relation between the number of NMOS transistors or second field-effect transistors connected in series and the discharging time, analyzed by a circuit simulator. In FIG. 14, A represents the characteristic of the conventional NMOS circuit and B the characteristic of the BiCMOS circuit of this embodiment.

Figure 15:
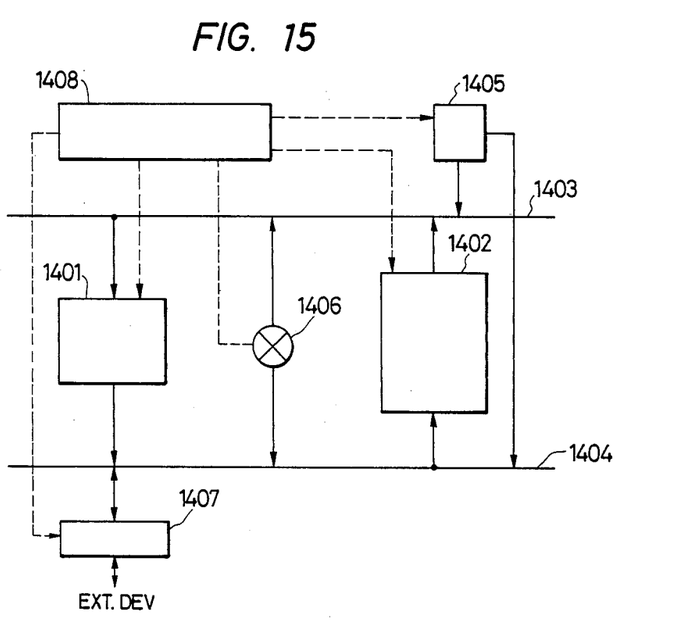
FIG. 15 is a diagram showing a data processing apparatus, the eighth embodiment of this invention.

FIG. 15 is a block diagram showing one example of major portion of a data processing apparatus which is the eighth embodimetn of this invention. The data processing apparatus shown in FIG. 15 preferably is a microprocessor integrated in one or two semiconductor substrates.

The data processing device of FIG. 15 comprises: bus means to connect the data processing means and the data storage means; a precharging means to charge the bus means to high level; leakage current compensation means (not illustrated) connected to the bus means; a control section for controlling the data processing section, data storage section, bus means and precharging means; whereby at least one of the data processing section and the data storage section has a bipolar transistor and a bus discharging means, the bipolar transistor having its collector connected to the bus means and emitter to the reference voltage, the bus discharging means consisting of a first field-effect transistor switch means and one or more second field-effect transistors, the first field-effect transistor switch means being connected between the bus means and the base of the bipolar transistor and adapted to be turned on by the control signal applied to its gate at a specified timing while the precharging means is deenergized, the second field-effect transistor being adapted to be turned on and off by the input signal applied to its gate.

In FIG. 15, denoted 1401 is a data processing means which takes data from the data bus, processes the data according to the control signal from the control means 1408 and then put the result on the data bus 1404. Reference number 1402 denotes a data storage means which accepts data from the data bus 1404 and stores it in accordance with the instruction from the control means 1408. The stored data is read out and output to the data bus 1403 according to the instruction from the control means 1408. 1405 is a precharging means to charge the buses 1403 and 1404 in response to the instruction from the control means 1408. 1406 represents a bus switch which in response to the instruction from the control means 1408 performs bidirectional data transfer between the buses 1403 and 1404. Designated 1407 is a latch register which according to the instruction from the control means 1408 exchanges data between the data bus 1404 and an external device. The control means 1408 controls the operation of the entire data processing apparatus. In the figure, the broken lines indicate the flow of control signals from the control means 1408.

The data processing means 1401 contains arithmetic operation circuit and logic operation circuit such as shown in FIGS. 6 and 7 (note, however, that the PMOS transistors 601 and 701 for precharging purpose do not require these circuits because they have precharging means) and, according to the calculation result, the NPN bipolar transistor discharges the bus 1404. The data storage means 1402 is formed of a register device as shown in FIG. 10 and the bus 1403 is discharged by the NPN bipolar transistor at the output stage. The bus switch 1406 has a circuitry of, say, FIG. 9 and discharges the destination bus 1403 or 1404 by means of the NPN bipolar transistor. To summarize, in the data processing apparatus of this embodiment, since the dynamic bus connecting the data processing section and the data storage section is quickly discharged by the bipolar transistor which is controlled on and off by the field-effect transistor, the data processing cycle can be reduced to a great extent.

In other words, since the dynamic circuit of this invention and its applied apparatus have their major logic section of the circuit formed of high-density field-effect transistors and their output section formed of at least one bipolar transistor with a large current sink capability, it is possible to obtain a maximum increase in operation speed with a minimum increase in parts.

We claim:

1. A dynamic logic circuit containing at least one bipolar transistor and a plurality of field-effect transistors, comprising:
a bipolar transistor having a collector, a base and an emitter with the collector-emitter current path connected between an output of said dynamic logic circuit and a first potential;
precharging means coupled between a second potential and the output of said dynamic logic circuit for precharging said output to a predetermined level according to at least one clock signal which periodically changes its state; and
at least two field-effect transistors having their source-drain current paths connected in series between the output of said dynamic logic circuit and the base of said bipolar transistor, one of said field-effect transistors assuming an on or off state opposite to that of said precharging means in response to the clock signal, and the other of said field-effect transistors operating in response to at least one input signal.

2. A dynamic logic circuit according to claim 1, further comprising a discharging means connected between the base of said bipolar transistor and a third potential to form a current path for discharging the stored charge of said bipolar transistor when said bipolar transistor changes its state from on to off.

3. A dynamic logic circuit containing at least one bipolar transistor and a plurality of field-effect transistors, comprising:
a bipolar transistor having a collector, a base and an emitter with the collector-emitter current path connected between an output of said dynamic logic circuit and a first potential;
a precharging means coupled between a second potential and the output of said dynamic logic circuit for precharging said output to a predetermined level according to at least one clock signal which periodically changes its state; and
at least one first field-effect transistor which assumes an on or off state opposite to that of said precharging means in response to the clock signal; and
at least one second field-effect transistor which operates in response to at least one input signal; whereby the source-drain current paths of said first and second field-effect transistors are connected in series between the output of said dynamic logic circuit and the base of said bipolar transistor.

4. A dynamic logic circuit according to claim 3, further comprising a leak current compensation means coupled between the second potential and the output of said dynamic logic circuit, and including means to prevent output variations of said dynamic logic circuit when at least one of said first and second field-effect transistors is off.

5. A dynamic logic circuit according to claim 3, further comprising a discharging means connected between the base of said bipolar transistor and a third potential to form a current path for discharging the stored charge of said bipolar transistor when said bipolar transistor changes its state from on to off.

6. A dynamic logic circuit according to claim 3, wherein said bipolar transistor has a collector and an emitter of a first conductivity type and a base of a second conductivity type, and wherein said first and second field-effect transistors are of the first conductivity type.

7. A dynamic logic circuit according to claim 3, wherein said precharging means is made up of at least one third field-effect transistor.

8. A dynamic logic circuit according to claim 6, wherein said precharging means is made up of at least one third field-effect transistor of the second conductivity type.

9. A data processing apparatus integrated in at least one semiconductor substrate and containing a dynamic logic circuit; the dynamic logic circuit comprising:
a bipolar transistor having a collector, a base and an emitter with the collector-emitter current path connected between an output of said dynamic logic circuit and a first potential;

a precharging means coupled between a second potential and the output of said dynamic logic circuit for precharging said output to a predetermined level in response to at least one clock signal which periodically changes its state; and at least two field-effect transistors having their source-drain current path connected between the output of said dynamic logic circuit and the base of said bipolar transistor, one of said field-effect transistors being coupled to assume an on or off state opposite to that of said precharging means in response to the clock signal, and the other of said field-effect transistors operating in response to at least one input signal.

10. A data processing apparatus integrated in at least one semiconductor substrate and containing a dynamic logic circuit; said dynamic logic circuit comprising:

a bipolar transistor having a collector, a base and an emitter with the collector-emitter current path connected between an output of said dynamic logic circuit and a first potential;

a precharging means coupled between a second potential and the output of said dynamic logic circuit for precharging said output to a predetermined level in response to at least one clock signal which periodically changes its state;

at least one first field-effect transistor which assumes an on or off state opposite to that of said precharging means in response to the clock signal; and at least one second field-effect transistor which operates in response to at least one input signal; whereby the source-drain current paths of said first and second field-effect transistors are connected in series between the output of said dynamic logic circuit and the base of said bipolar transistor.

* * * * *